United States Patent
Liu et al.

(10) Patent No.: US 10,159,151 B1
(45) Date of Patent: Dec. 18, 2018

(54) CHIP PACKAGE CIRCUIT BOARD MODULE

(71) Applicant: Unimicron Technology Corp., Taoyuan (TW)

(72) Inventors: Wen-Fang Liu, Taoyuan (TW);
Shao-Chien Lee, Taipei (TW);
Chen-Wei Tseng, New Taipei (TW);
Zong-Hua Li, Taoyuan (TW);
Chien-Tsai Li, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/622,078

(22) Filed: Jun. 14, 2017

(51) Int. Cl.
*H05K 1/18* (2006.01)
*H05K 1/11* (2006.01)

(52) U.S. Cl.
CPC .............. *H05K 1/181* (2013.01); *H05K 1/111* (2013.01)

(58) Field of Classification Search
CPC .... H05K 1/111; H05K 1/0292; H05K 1/0295; H05K 1/0206
USPC .......... 361/760–777, 782–784; 174/255–264
See application file for complete search history.

(56) References Cited

U.S. PATENT DOCUMENTS

| | | | | |
|---|---|---|---|---|
| 5,019,941 A | * | 5/1991 | Craft | H05K 1/0206 174/16.3 |
| 5,805,428 A | * | 9/1998 | Singer | H05K 1/0295 174/261 |
| 6,115,262 A | * | 9/2000 | Brunner | H05K 1/111 174/260 |
| 7,872,874 B2 | * | 1/2011 | Karasawa | H05K 1/111 361/767 |
| 2003/0063447 A1 | * | 4/2003 | Cwik | H05K 1/0292 361/767 |
| 2008/0130255 A1 | * | 6/2008 | Noguchi | H05K 1/0295 361/771 |

FOREIGN PATENT DOCUMENTS

| | | |
|---|---|---|
| CN | 102102862 | 6/2011 |
| CN | 103107274 | 5/2013 |
| CN | 104538391 | 4/2015 |

* cited by examiner

*Primary Examiner* — Tuan T Dinh
(74) *Attorney, Agent, or Firm* — JCIPRNET

(57) ABSTRACT

A chip package circuit board module including a circuit board and at least one original chip is provided. The circuit board includes at least one first pad, at least one second pad and at least one substitute pad. The at least one second pad is located besides the at least one first pad and separated from the at least one first pad. The at least one substitute pad is adjacent to the at least one second pad and separated from the at least one first pad and the at least one second pad. The at least one original chip is connected to the at least one first pad and at least one the second pad, respectively. A total width of a portion corresponding to each of the at least one second pad and a portion corresponding to the substitute pad adjacent to the second pad of the first pad is greater than or equal to twice a width of the original chip.

6 Claims, 14 Drawing Sheets

CHIP PACKAGE CIRCUIT BOARD MODULE

BACKGROUND OF THE INVENTION

1. Field of the Invention

The invention relates to a circuit board module, and more particularly, to a chip package circuit board module.

2. Description of Related Art

In general, a circuit board module of a light-emitting diode (LED) chip has a LED chip packaged onto a circuit board. However, when the LED chip is unable to emit light due to damages, packaging failures or other reasons, it is required to remove the LED chip, and clean up pads on the circuit board (sometimes, reprinting solder paste is also required) before a new LED chip can be packaged again.

Nonetheless, a reworking process as described above may face the following problems: copper wires on a surface of the circuit board may be peeled off together when the LED chip is to be peeled off; because it may require a high temperature to applied in the process of peeling off the LED chip, the circuit board may exhibit unexpected thermal expansion or contraction in the high temperature environment which may damage the circuit board and lower a reliability of the circuit board; since the pads may be damaged when the LED chip is to be peeled off, packaging the new LED chip at the same position may face issues like yield reduction.

SUMMARY OF THE INVENTION

The invention provides a chip package circuit board module, which has a substitute chip that can be rapidly and easily disposed on a circuit board, a high yield rate, and a more intensive and more flexible design for routing on a surface while allowing the surface to include less glossy for reducing influences on display presentation.

A chip package circuit board module of the invention includes a circuit board and at least one original chip. The circuit board includes at least one first pad, at least one second pad and at least one substitute pad. The at least one second pad is located besides the at least one first pad and separated from the at least one first pad. The at least one substitute pad is adjacent to the at least one second pad and separated from the at least one first pad and the at least one second pad. The at least one original chip is connected to the at least one first pad and the at least one second pad, respectively. A total width of a portion corresponding to each of the at least one second pad and a portion corresponding to the substitute pad adjacent to the second pad of the first pad is greater than or equal to twice a width of the original chip.

In an embodiment of the invention, the at least one first pad includes at least one first branch. The at least one first branch are connected to one another and correspond to the at least one second pad and the at least one substitute pad, respectively, and each of the at least one original chip is connected to the corresponding second pad and the first branch corresponding to the corresponding second pad.

In an embodiment of the invention, the chip package circuit board module further includes at least one substitute chip, connected to the at least one first pad and the at least one substitute pad, respectively. The circuit board further includes at least one conductive member, connected to the at least one substitute pad and the at least one second pad, respectively.

In an embodiment of the invention, a number of the at least one second pad is identical to a number of the at least one substitute pad.

In an embodiment of the invention, a number of the at least one second pad is greater than a number of the at least one substitute pad.

In an embodiment of the invention, a number of the at least one second pad is less than a number of the at least one substitute pad.

A chip package circuit board module of the invention at least includes a multi-layer circuit board and an original chip. The multi-layer circuit board has a surface and includes a first pad, at least one second pad, at least one substitute pad and an inner-layer line. The first pad, the second pad and the substitute pad are located on the surface. The second pad is located besides the first pad and separated from the first pad. The substitute pad is adjacent to the second pad and separated from the first pad. The inner-layer line connects through the second pad and the substitute pad. The original chip is connected to the first pad and the second pad, respectively. A total width of a portion corresponding to the second pad and a portion corresponding to the substitute pad of the first pad is greater than or equal to twice a width of the original chip.

In an embodiment of the invention, the first pad includes two first branches. The two first branches are connected to each other and correspond to the second pad and the substitute pad, respectively, and each of the at least one original chip is connected to the corresponding second pad and the first branch corresponding to the corresponding second pad.

In an embodiment of the invention, the chip package circuit board module at least further includes a substitute chip, connected to the substitute pad and the first branch corresponding to the substitute pad.

In an embodiment of the invention, the chip package circuit board module at least further includes a substitute chip, connected to the first pad and the substitute pad.

Based on the above, according to the chip package circuit board module of the invention, the first pad, the second pad and the substitute pad for the second pad are disposed on the circuit board and separated from one another. Also, the first pad has the portion corresponding to the second pad and the portion corresponding to the substitute pad, and the original chip is connected to the first pad and the second pad. When the original chip is inoperative, the substitute chip can be directly connected to the first pad and the substitute pad, and connected to the substitute pad and the second pad through the additionally-disposed conductive member. Accordingly, it is not required to remove the original chip during the reworking process but directly replace the original chip with the substitute chip, and thus the steps in the reworking process can be effectively reduced. Alternatively, the chip package circuit board module of the invention can adopt the multi-layer circuit board in which the second pad and the substitute pad for the second pad are connected through in the inner layer in advance. In this way, when the original chip is inoperative, the substitute chip can operate as a replacement of the original chip simply by directly connecting the substitute chip to the first pad and the substitute pad without removing the original chip.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
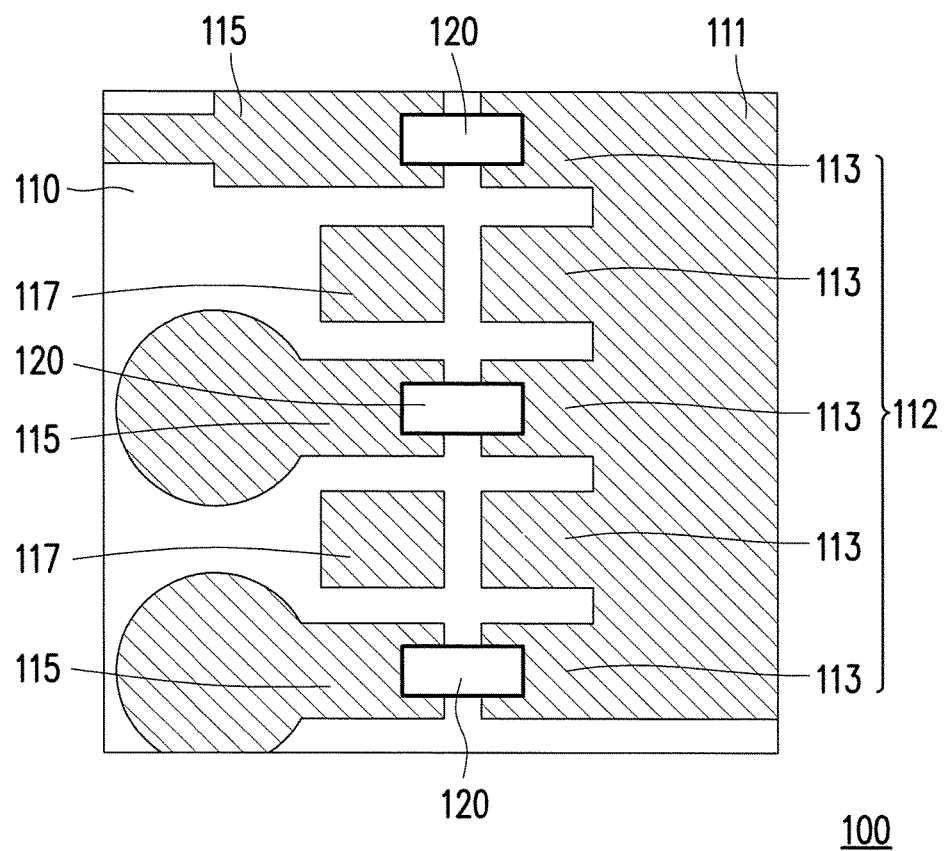
FIG. 1 is a schematic diagram of a chip package circuit board module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a chip package circuit board module according to an embodiment of the invention. With reference to FIG. 1, a chip package circuit board module 100 of the present embodiment includes a circuit board 110 and at least one original chip 120. The circuit board 110 includes at least one first pad 112, at least one second pad 115 and at least one substitute pad 117. In the present embodiment, the first pad 112 includes at least one first branch 113, and these first branches 113 are connected to one another and correspond to the second pad 115 and the substitute pad 117, respectively. In view of FIG. 1, the first branches 113 of the first pad 112 are connected through a connection portion 111. However, in other embodiments, the first branches 113 of the first pad 112 may also be separated from one another if needed.

Each of the second pads 115 is located besides the first pad 112 and separated from the first pad 112. The substitute pad 117 is adjacent to the second pad 115 and separated from the first pad 112 and the second pad 115. The second pads 115 and the substitute pads 117 are staggered arranged side by side. As shown in FIG. 1, each of the original chips 120 is connected to the second pad 115 and the corresponding first branch 113.

In the present embodiment, a number of the original chips 120 and a number of the second pads 115 are three, for example; a number of the substitute pads 117 is two, for example; and a number of the first branches 113 is five, for example. Nonetheless, the number of the original chips 120, the number of the substitute pads 117, the number of the first branches 115, and the arrangement for the second pads 115 and the substitute pads 117 are not limited to the above. Moreover, in the present embodiment, for example, the circuit board 110 may be a single-layer circuit board or a multi-layer circuit board and the original chip 120 may be an LED chip. Nevertheless, the type of the original chip 120 is not limited to the above.

Figure 2:
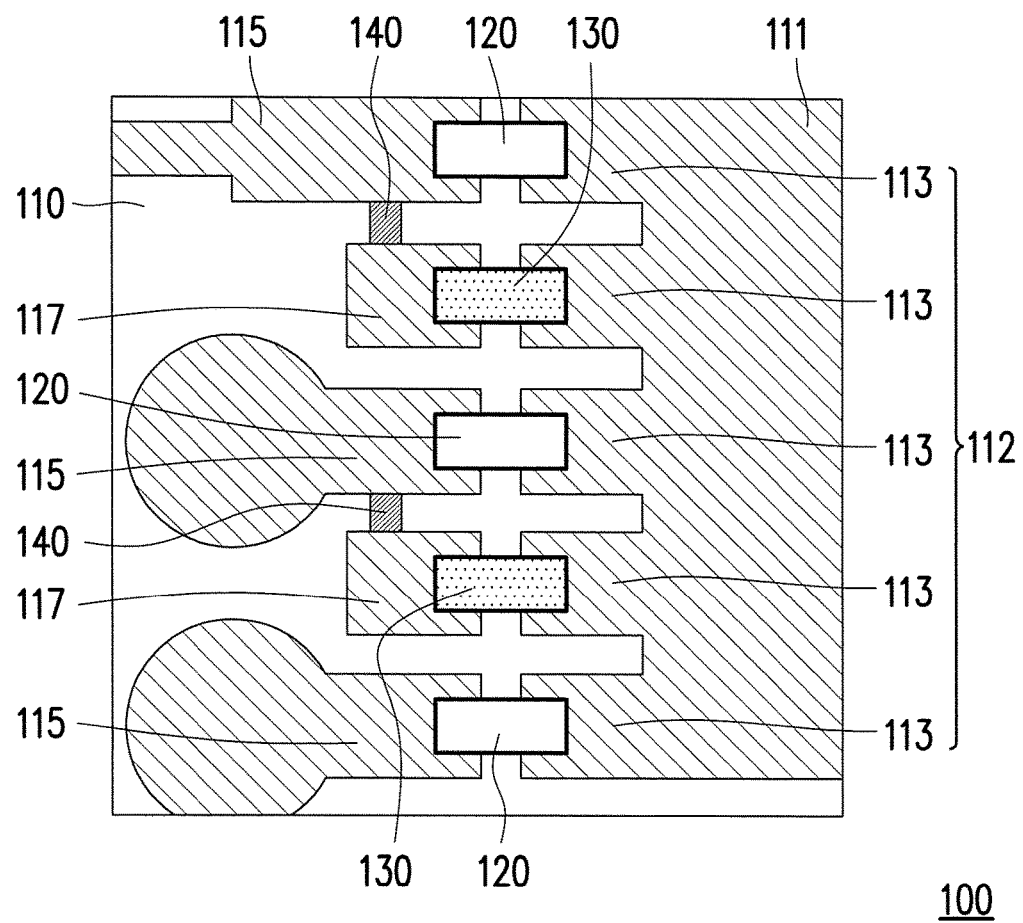
FIG. 2 and FIG. 3 are schematic diagrams for disposing a substitute chip and a conductive member on the chip package circuit board module of FIG. 1.
Figure 3:
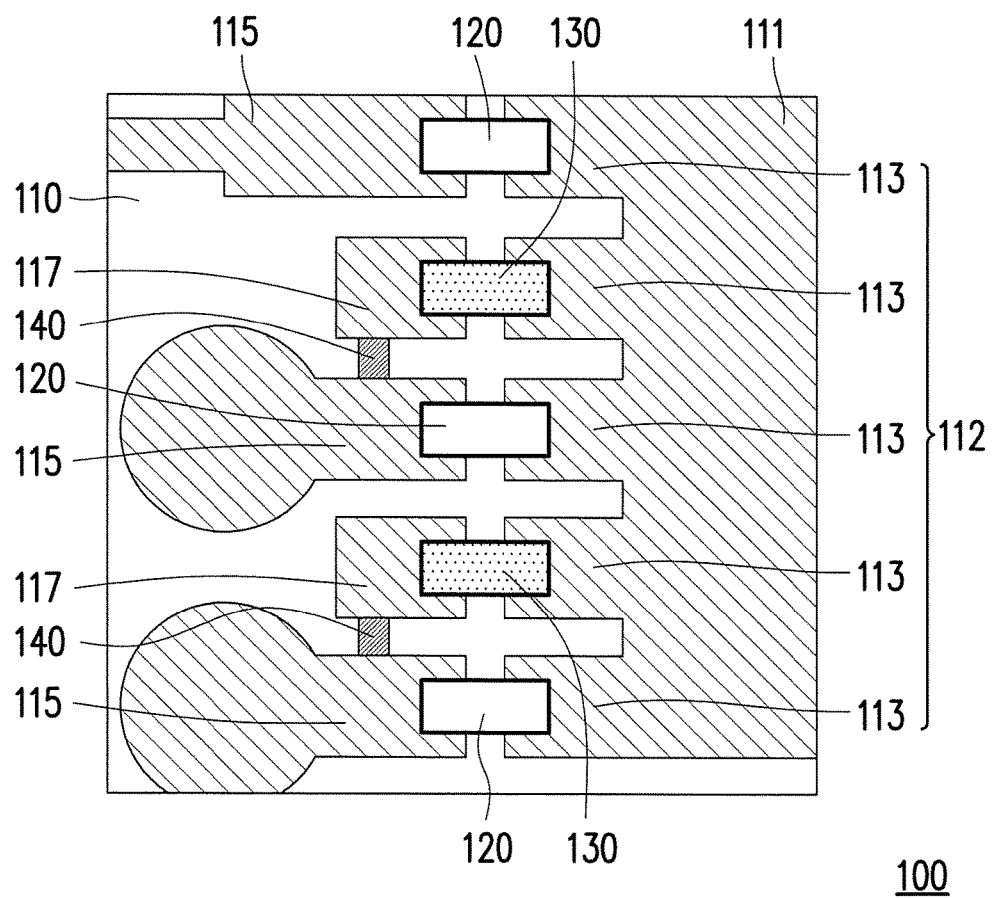

In certain cases, if the original chip 120 is inoperative, the chip package circuit board module 100 then requires maintenance. FIG. 2 and FIG. 3 are schematic diagrams for disposing a substitute chip and a conductive member on the chip package circuit board module of FIG. 1. Referring to FIG. 2 first, in the present embodiment, intentionally, the substitute pad 117 is disposed besides the second pad 115, and a portion corresponding to the substitute pad 117 of the first pad 112 has the corresponding first branch 113. In this way, because it is not required to remove the original chip 120 during maintenance, maintenance personnel can directly connect a substitute chip 130 to the substitute pad 117 and one of the first branches 113 of the first pad 112. Also, after connecting to the second pad 115 and the substitute pad 117 connected by the inoperative original chip 120 through at least one conductive member 140, the substitute chip 130 can operate as a replacement of the original chip 120. Because it is not required to remove the original chip 120, steps in the reworking process can be effectively reduced.

More specifically, in view of FIG. 2, taking the original chip 120 at the top and the original chip 120 at the middle which are inoperative as an example, after connecting two of said substitute chips 130 to the substitute pads 117 and the corresponding first branches 113 and connecting the conductive members 140 to the second pads 115 and the substitute pads 117 disposed for the inoperative original chips 120, the two substitute chips 130 can then be used to replace the original chip 120 at the top and the original chip 120 at the middle. Because it is not required to remove the inoperative original chips 120, steps in the reworking process can be effectively reduced.

In view of FIG. 3, taking the original chip 120 at the middle and the original chip 120 at the bottom which are inoperative as an example, after connecting two of said substitute chips 130 to the substitute pads 117 and the corresponding first branches 113 and connecting the conductive members 140 to the second pads 115 and the substitute pads 117 disposed for the inoperative original chips 120, the two substitute chips 130 can then be used to replace the original chip 120 at the middle and the original chip 120 at the bottom.

Naturally, in an example not illustrated, if the original chip 120 at the top and the original chip 120 at the bottom which are inoperative are taken as an example, after connecting two of said substitute chips 130 to the substitute pads 117 and the corresponding first branches 113 and connecting the conductive members 140 to the second pads 115 and the substitute pads 117, the two substitute chips 130 can then be used to replace the original chip 120 at the top and the original chip 120 at the bottom.

It is noted that, in the present embodiment, the conductive member 140 may be a metallic laid wire attached to the circuit board 110 in an adhesion manner and connected to the substitute pad 117 and the second pad 115 for maintenance personnel to operate conveniently. Naturally, the type of the conductive member 140 is not limited to the above as long as such member can connect through the substitute pad 117 and the second pad 115.

In the present embodiment, the reason why the conductive member 140 is not connected to the substitute pad 117 and the second pad 115 in advance is that, a number of the substitute chips 130 to be disposed may be less than the number of the original chips 120 because not all the original chips 120 will be damaged. Considering that the circuit board 110 has limited space, if too many pads or branches prepared for connecting the substitute chips 130 are disposed, there may be a high proportion of pads or branches left idle in the circuit board 110.

Accordingly, in order to improve space utilization for the circuit board 110, in FIG. 1, a design in which the number of the original chips 120 is greater than the number of the substitute chips 130 and a design in which two adjacent original chips 120 can share one substitute pad 117 for connecting the substitute chips 130 are adopted. As shown in FIG. 1, the substitute pads 117 are located between the two second pads 115 respectively at the top and the bottom, such that maintenance personnel can decide to connect the conductive member 140 to the substitute pad 117 and one specific second pad 115, depending on which specific one of the original chips 120 is damaged.

Naturally, in other embodiments, the number of the substitute chips 130 may also be identical to the number of the original chips 120. In other words, whenever a defect occurs on one of the original chips 120, one corresponding substitute chip 130 can be used as the replacement. Alternatively, in other embodiments, the number of the substitute pads 117 may be greater than the number of the second pads 115 so that each of the original chips 120 can have more chance than once to be replaced by the substitute chip 130.

In the present embodiment, for example, the original chip 120 and the substitute chip 130 are the same type of chips with identical widths. For allowing the first pad 112 to include a sufficient dimension for connecting with the original chips 120 and the substitute chips 130, in the present embodiment, a total width of a portion corresponding to each of the second pads 115 (i.e., one of the first branches 113) and a portion corresponding to the substitute pads 117 corresponding to the second pads 115 (i.e., another one of the first branches 113) of the first pad 112 is greater than or equal to twice a width of each of the original chips 120.

In addition, in FIG. 1, it is illustrated that the first branches 113 and the second pads 115 have the identical widths. Nonetheless, it is also possible that, the widths of the first branches 113 and the second pads 115 may be different, the widths of these first branches 113 may be different, and/or the widths of these second pads 115 may be different, which are not limited by what illustrated in the drawings.

Chip package circuit board modules with other implementations will be introduced as follows. It should be noted, in the following embodiments, only the difference between the different embodiments is described, whereas elements identical or similar to those described in the foregoing embodiment are represented by same reference numbers and descriptions regarding the same are not repeated hereinafter.

Figure 4:
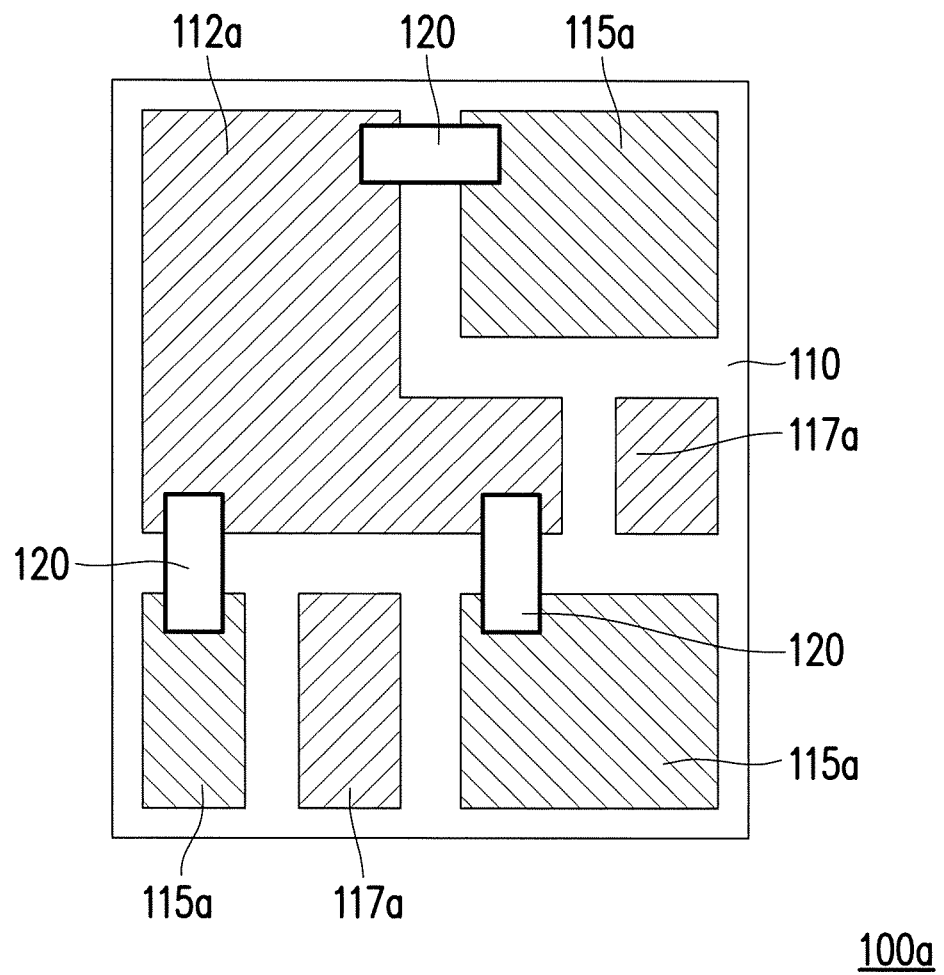
FIG. 4 is a schematic diagram of a chip package circuit board module according to another embodiment of the invention.
Figure 5:
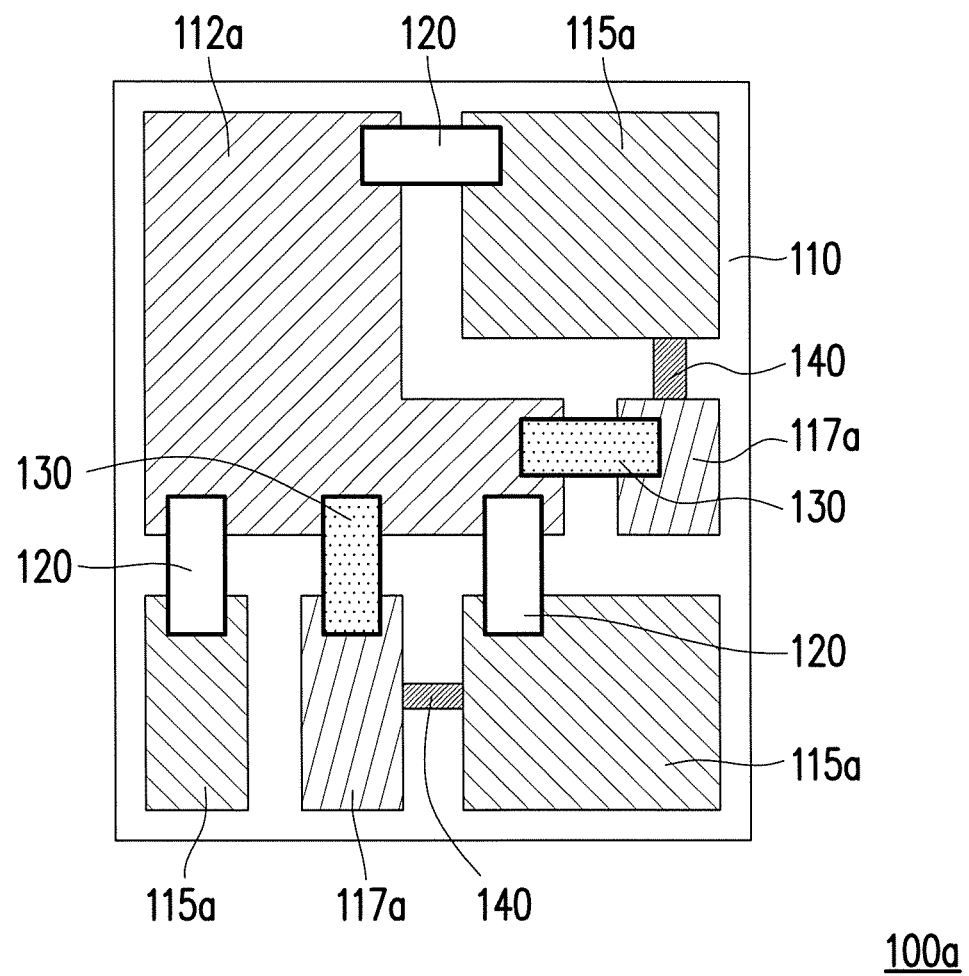
FIG. 5 and FIG. 6 are schematic diagrams for disposing a substitute chip and a conductive member on the chip package circuit board module of FIG. 4.
Figure 6:
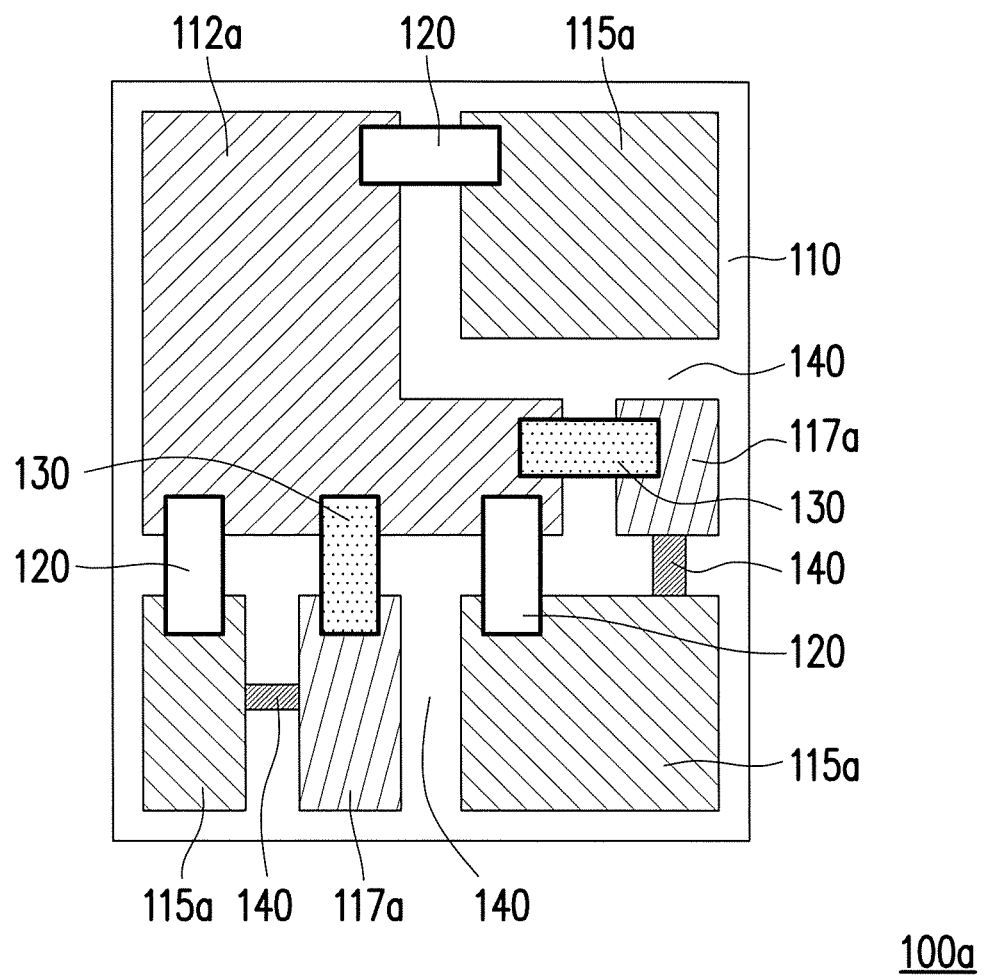

FIG. 4 is a schematic diagram of a chip package circuit board module according to another embodiment of the invention. FIG. 5 and FIG. 6 are schematic diagrams for disposing a substitute chip and a conductive member on the chip package circuit board module of FIG. 4. With reference to FIG. 4 to FIG. 6, a major difference between a chip package circuit board module 100a of FIG. 4 and the chip package circuit board module 100 of FIG. 1 is that, first pads 112a, second pads 115a and substitute pads 117a of the present embodiment have different shapes and disposed positions. Similarly, it is not required to remove the original chip 120 when the original chip 120 is inoperative, but directly connect the substitute chip 130 to the first pad 112a and the substitute pad 117a and connect the conductive member 140 to the second pad 115a and the corresponding substitute pad 117a disposed for the original chip 120, as shown in FIG. 5 and FIG. 6. By doing so, the substitute chip 130 can then operate as a replacement of the original chip 120. Naturally, the shapes and the disposed positions of the first pad 112a, the second pads 115a and the substitute pads 117 are not limited to the above.

Figure 7:
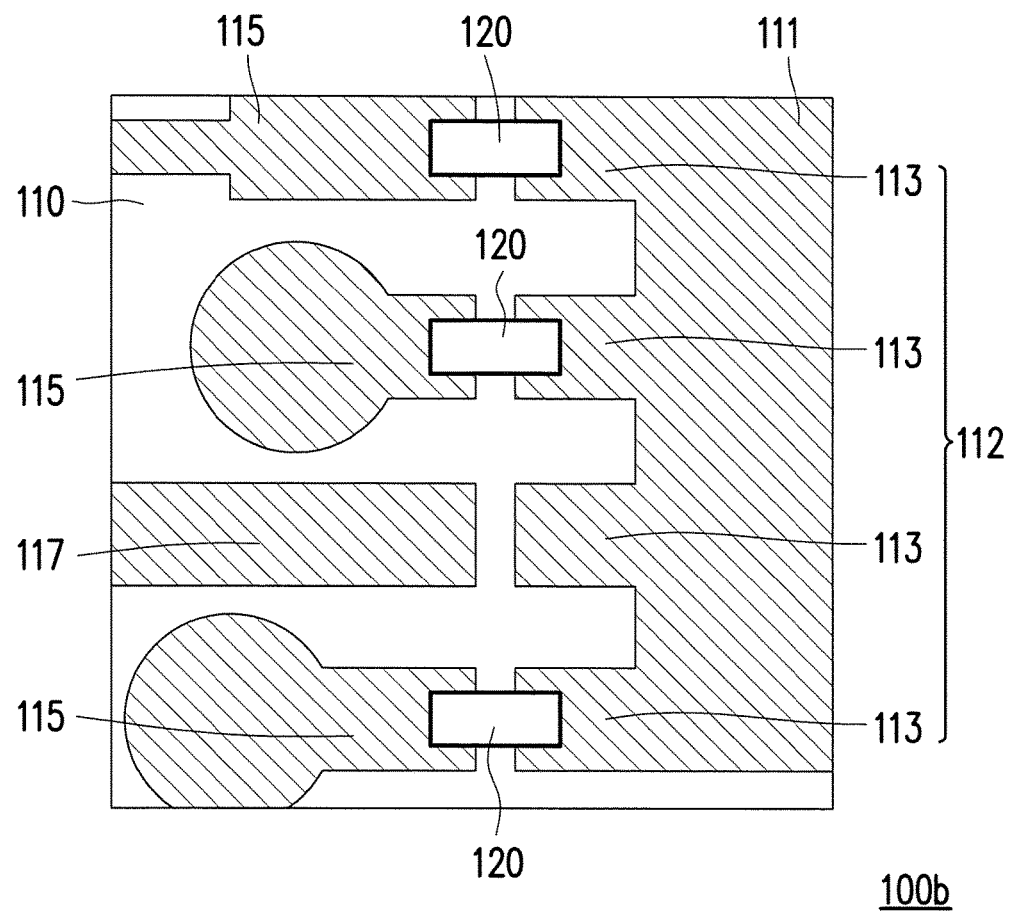
FIG. 7 is a schematic diagram of a chip package circuit board module according to another embodiment of the invention.
Figure 8:
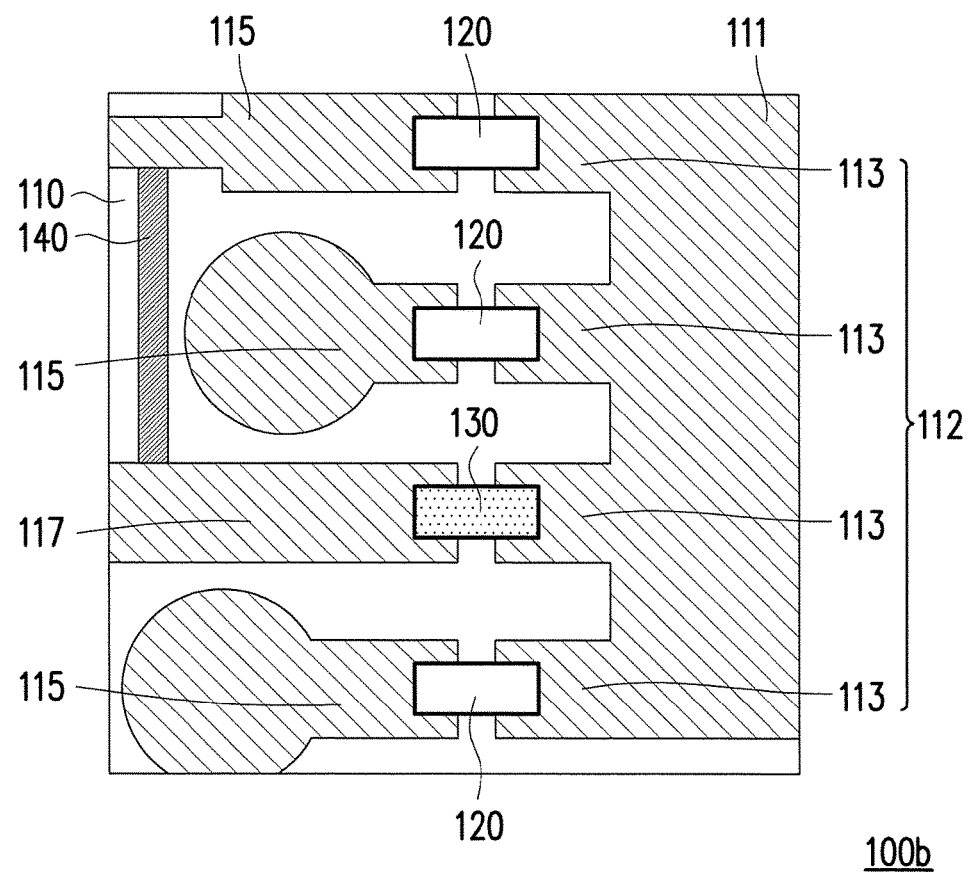
FIG. 8 to FIG. 10 are schematic diagrams for disposing a substitute chip and a conductive member on the chip package circuit board module of FIG. 7.
Figure 9:
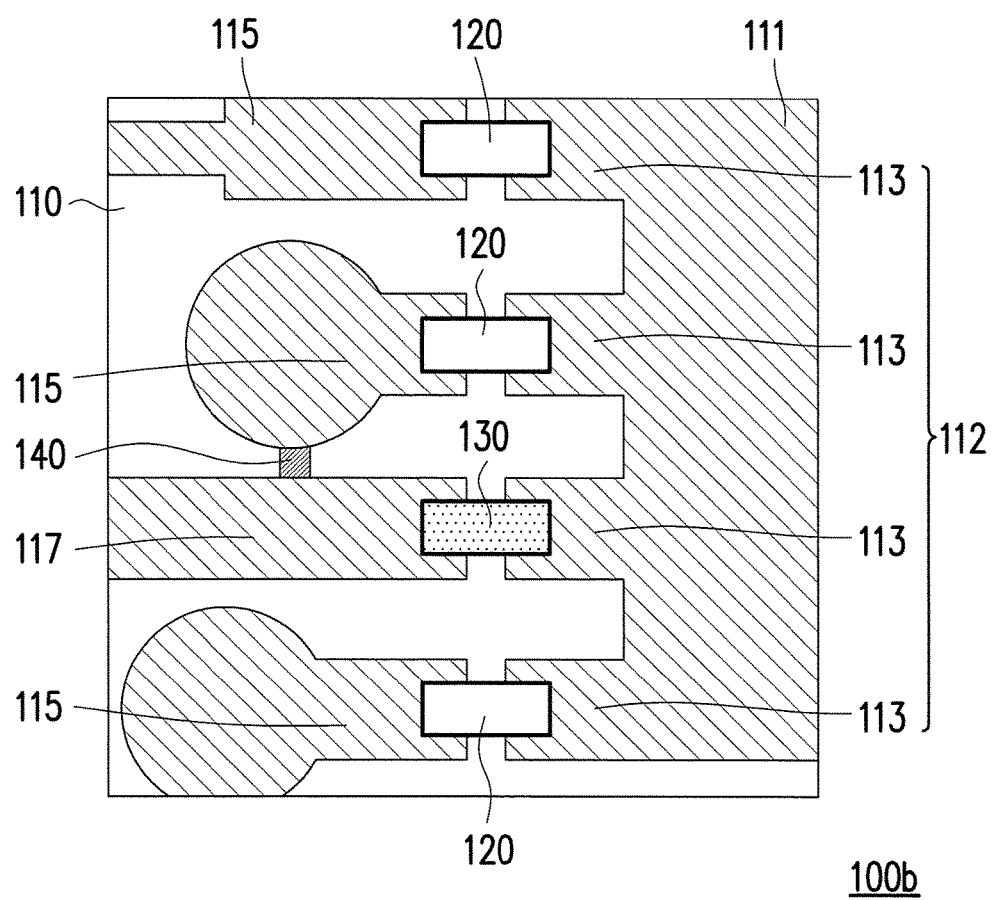
Figure 10:
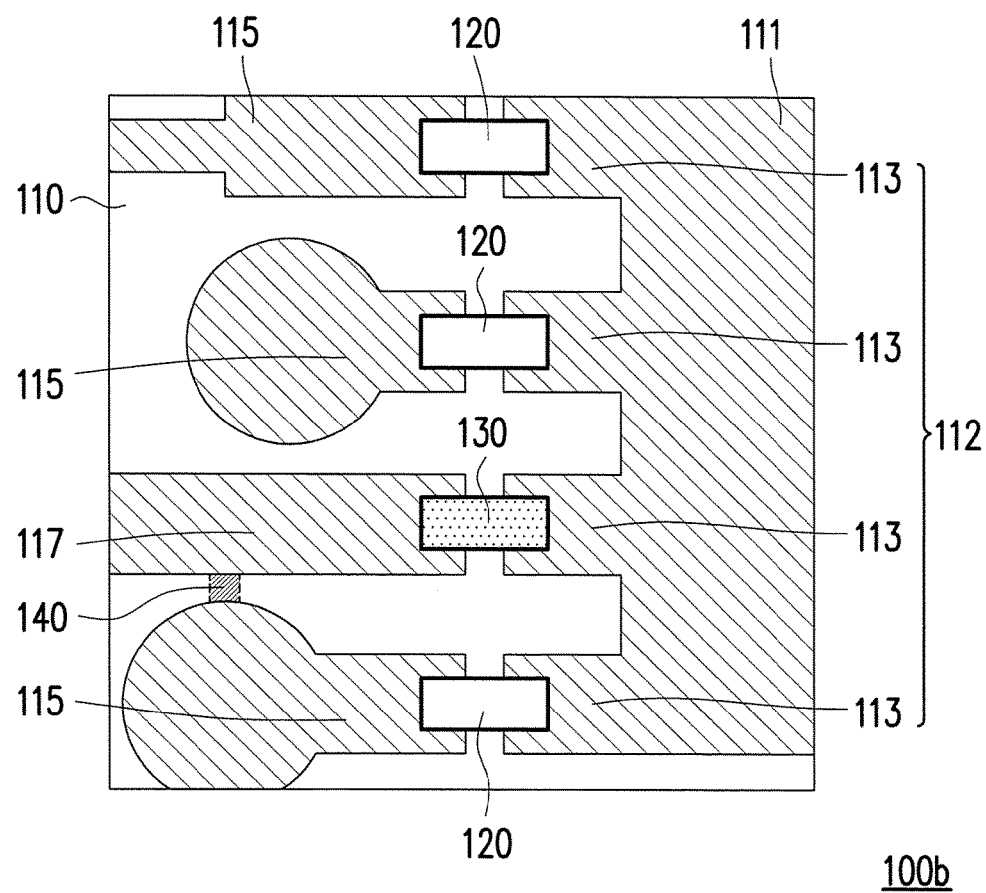

FIG. 7 is a schematic diagram of a chip package circuit board module according to another embodiment of the invention. FIG. 8 to FIG. 10 are schematic diagrams for disposing a substitute chip and a conductive member on the chip package circuit board module of FIG. 7. With reference to FIG. 7 to FIG. 10, a major difference between a chip package circuit board module 100b of FIG. 7 and the chip package circuit board module 100 of FIG. 1 is that, three original chips 120 share one substitute chip 130 in the present embodiment. FIG. 8 to FIG. 10 are respectively used to describe how the conductive member 140 is connected when the substitute chip 130 is disposed in the case where one of the original chips 120 from top down is damaged, for example. Again, it is not required to remove the original chip 120 when the original chip 120 is inoperative, but directly connect the substitute chip 130 to the substitute pad 117 and the corresponding first branch 113 and connect the conductive member 140 to the second pad 115 and the substitute pad 117 disposed for the original chip 120. By doing so, the substitute chip 130 can then operate as a replacement of the original chip 120.

Figure 11:
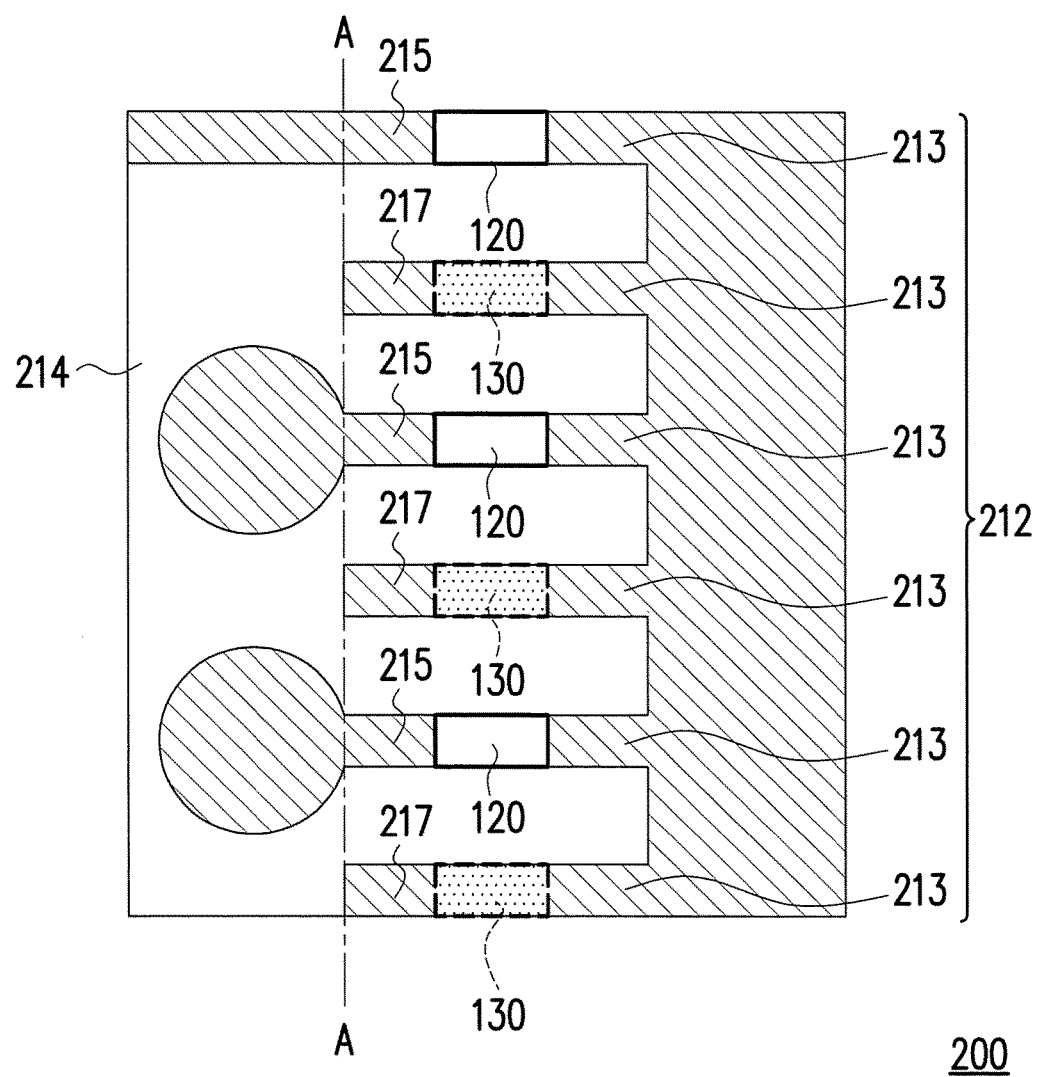
FIG. 11 is a schematic diagram of a chip package circuit board module according to another embodiment of the invention.
Figure 12:
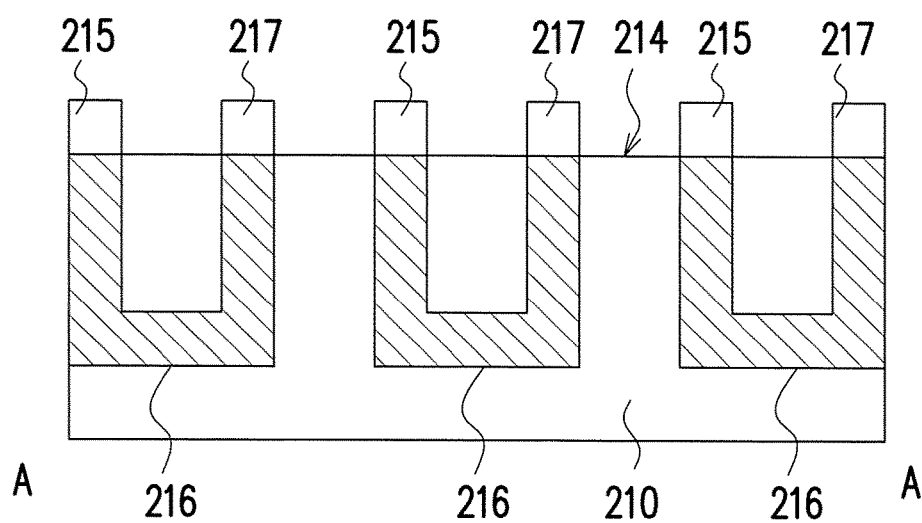
FIG. 12 is a cross-sectional view of FIG. 11 along a line segment A-A.

FIG. 11 is a schematic diagram of a chip package circuit board module according to another embodiment of the invention. FIG. 12 is a cross-sectional view of FIG. 11 along a line segment A-A. With reference to FIG. 11 and FIG. 12, a chip package circuit board module 200 of the present embodiment includes a multi-layer circuit board 210 and at least one original chip 120. The multi-layer circuit board 210 has a surface 214 and includes a first pad 212, at least one second pad 215, at least one substitute pad 217 and an inner-layer line 216.

The first pad 212, the second pad 215 and the substitute pad 217 are located on the surface 214. The first pad 212 includes a plurality of first branches 213. These first branches 213 are connected to one another and correspond to the second pad 215 and the substitute pad 217, respectively. The second pad 215 is located besides the first pad 212 and separated from the first pad 212. The substitute pad 217 is adjacent to the second pad 215 and separated from the first pad 212. The original chip 120 is connected to the first pad 212 and the second pad 215, respectively. More specifically, each of the at least one original chip 120 is connected to the corresponding second pad 215 and the first branch 213 corresponding to the corresponding second pad 215. A total width of a portion corresponding to the second pad 215 and a portion corresponding to the substitute pad 217 of the first pad 212 is greater than or equal to twice a width of the original chip 120.

In the present embodiment, the chip package circuit board module 200 includes three said original chips 120, the multi-layer circuit board 210 includes three said second pads 215 and three said substitute pads 217, and the first pad 212 includes six said first branches 213. In other words, a number of the original chips 120 is identical to a number of the second pads 215, the number of the second pads 215 is identical to a number of the substitute pads 217, and a number of the first branches 213 is a sum of the number of the second pads 215 and the number of the substitute pads 217. In view of FIG. 12, in the present embodiment, the inner-layer circuit 216 connects through the second pad 215 and the corresponding substitute pad 217. In other words, in the present embodiment, each of the original chips 120 has one chance to be replaced by the substitute chip 130.

In the present embodiment, because the second pad 215 and the corresponding substitute pad 217 are already connected through by the inner-layer line 216, when the original chip 120 is inoperative, it is only required to dispose the substitute chip 130 (as shown by dotted lines in FIG. 11) between the substitute pad 217 and the first branch 213 without additionally disposing the conductive member in the reworking process so the steps may be further simplified.

Moreover, in the chip package circuit board module 200 of the present embodiment, because the second pad 215 and the corresponding substitute pad 217 are connected through by the inner-layer line 216 instead of the conductive member disposed on the surface 214, routing on the surface 214 designed to be more intensive and more flexible. In addition, in the case where the chip package circuit board module 200 is applied to an LED display module, the surface 214 can be less glossy to reduce influences on display presentation.

Figure 13:
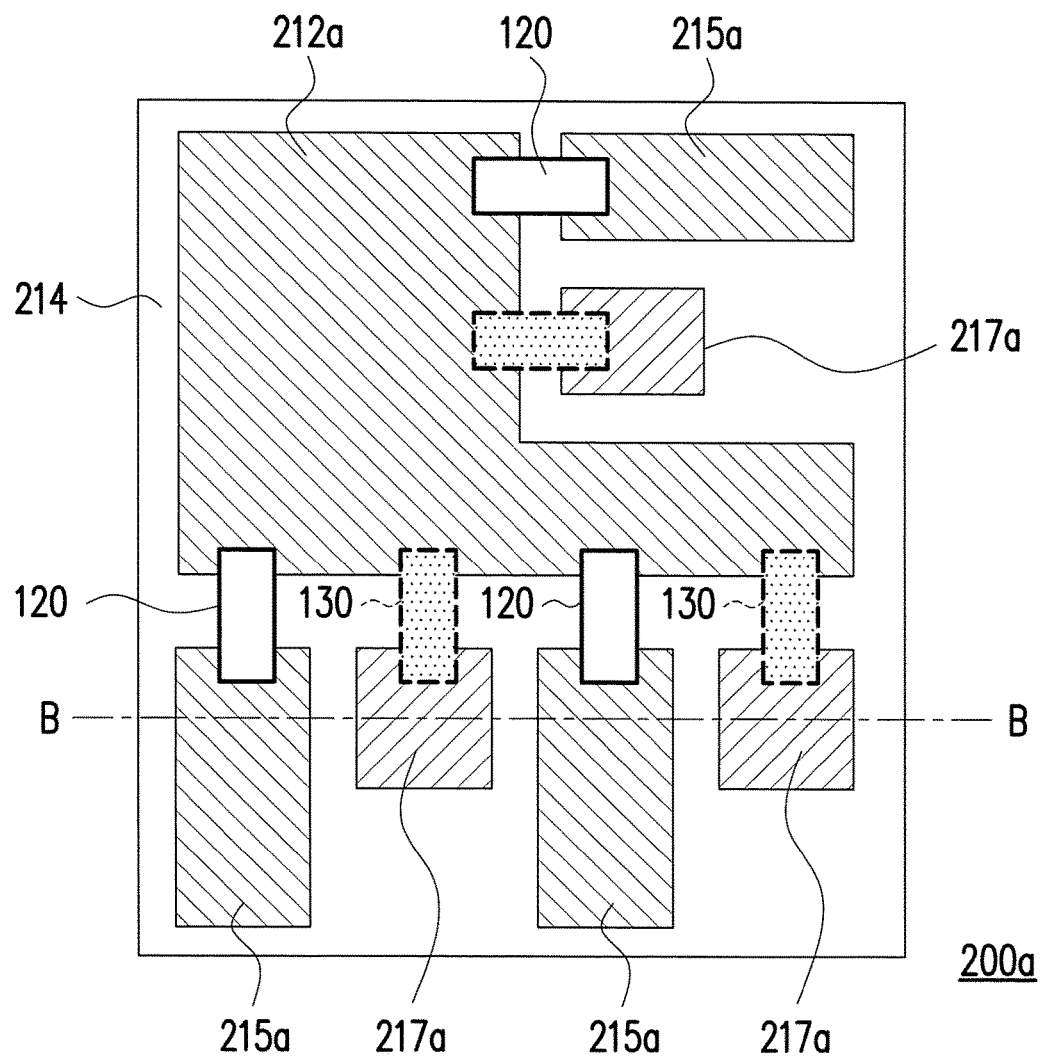
FIG. 13 is a schematic diagram of a chip package circuit board module according to another embodiment of the invention.
Figure 14:
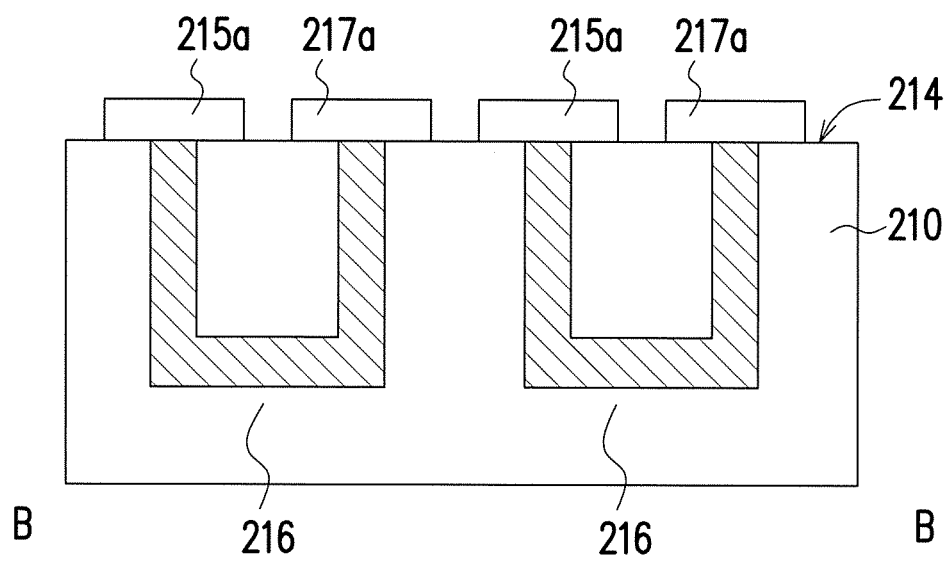
FIG. 14 is a cross-sectional view of FIG. 13 along a line segment B-B.

FIG. 13 is a schematic diagram of a chip package circuit board module according to another embodiment of the invention. FIG. 14 is a cross-sectional view of FIG. 13 along a line segment B-B. With reference to FIG. 13 and FIG. 14, a major difference between a chip package circuit board module 200a of FIG. 13 and the chip package circuit board module 200 of FIG. 11 is that, second pads 212a, second pads 215a and substitute pads 217a of the present embodiment have different shapes and disposed positions. What remained the same is that, each of the second pads 215a has the corresponding substitute pad 217a, and the second pad 215a and the corresponding substitute pad 217a are connected through by the inner-layer line 216, as shown in FIG. 14. Therefore, it is not required to remove the original chip 120 when the original chip 120 is inoperative, but directly connect the substitute chip 130 (as shown by dotted lines in FIG. 13) to the first pad 212a and the substitute pad 217a. By doing so, the substitute chip 130 can then operate as a replacement of the original chip 120.

In summary, according to the chip package circuit board module of the invention, the first pad, the second pad and the substitute pad for the second pad are disposed on the circuit board and separated from one another. Also, the first pad has the portion corresponding to the second pad and the portion corresponding to the substitute pad, and the original chip is connected to the first pad and the second pad. When the original chip is inoperative, the substitute chip can be directly connected to the first pad and the substitute pad, and connected to the substitute pad and the second pad through the additionally-disposed conductive member. Accordingly, it is not required to remove the original chip during the reworking process but directly replace the original chip with the substitute chip, and thus the steps in the reworking process can be effectively reduced. Alternatively, the chip package circuit board module of the invention can adopt the multi-layer circuit board in which the second pad and the substitute pad for the second pad are connected through in the inner layer in advance. In this way, when the original chip is inoperative, the substitute chip can operate as a replacement of the original chip simply by directly connecting the substitute chip to the first pad and the substitute pad without removing the original chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package circuit board module, comprising:
   a circuit board, comprising:
      at least one first pad;
      a plurality of second pads, located besides the at least one first pad and separated from the at least one first pad; and
      at least one substitute pad, adjacent to the second pads and separated from the at least one first pad and the second pads, wherein the second pads comprise two sub-second pads located at a side of the at least one substitute pad and adjacent to each other, an orthographic projection of a portion of one of the two sub-second pads, which is away from the at least one substitute pad, projected to the at least one substitute pad does not overlap an orthographic projection of the other one of the sub-second pads, which is close to the at least one substitute pad, projected to the at least one substitute pad; and
   at least one original chip, connected to the at least one first pad and a corresponding one of the second pads, respectively, wherein a total width of a portion corresponding to each of the second pads and a portion corresponding to the substitute pad adjacent to the second pads of the first pad is greater than or equal to twice a width of each of the at least one original chip.

2. The chip package circuit board module as recited in claim 1, wherein the at least one first pad comprises at least one first branch, the at least one first branch are connected to one another and correspond to the second pads and the at least one substitute pad, respectively, and each of the at least one original chip is connected to the corresponding one of the second pads and the first branch corresponding to the corresponding one of the second pads.

3. The chip package circuit board module as recited in claim 1, further comprising:
   at least one substitute chip, connected to the at least one first pad and the at least one substitute pad, respectively, wherein the circuit board further comprises the at least one conductive member, each of the at least one conductive member is connected to the at least one substitute pad and the corresponding one of the second pads.

4. The chip package circuit board module as recited in claim 1, wherein a number of the second pads is identical to a number of the at least one substitute pad.

5. The chip package circuit board module as recited in claim 1, wherein a number of the second pads is greater than a number of the at least one substitute pad.

6. The chip package circuit board module as recited in claim 1, wherein a number of the second pads is less than a number of the at least one substitute pad.

* * * * *